United States Patent
Johnson

(10) Patent No.: US 11,050,206 B2
(45) Date of Patent: *Jun. 29, 2021

(54) PREFORMED SOLDER-IN-PIN SYSTEM

(71) Applicant: Onanon, Inc., Milpitas, CA (US)

(72) Inventor: Dennis J. Johnson, Milpitas, CA (US)

(73) Assignee: Onanon, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/139,279

(22) Filed: Dec. 31, 2020

(65) Prior Publication Data

US 2021/0126416 A1    Apr. 29, 2021

Related U.S. Application Data

(63) Continuation of application No. 16/297,116, filed on Mar. 8, 2019, now Pat. No. 10,886,685.

(51) Int. Cl.
| | | |
|---|---|---|
| H01R 43/02 | (2006.01) | |
| H01R 24/86 | (2011.01) | |
| H01R 4/02 | (2006.01) | |
| H01R 13/04 | (2006.01) | |
| H01R 107/00 | (2006.01) | |

(52) U.S. Cl.
CPC ......... *H01R 43/0235* (2013.01); *H01R 4/024* (2013.01); *H01R 13/04* (2013.01); *H01R 24/86* (2013.01); *H01R 43/0263* (2013.01); *H01R 2107/00* (2013.01)

(58) Field of Classification Search
CPC .... H01R 43/0235; H01R 4/024; H01R 24/86; H01R 3/0263
USPC ....................................................... 439/874
See application file for complete search history.

(56) References Cited

U.S. PATENT DOCUMENTS

| | | | | | |
|---|---|---|---|---|---|
| 4,421,368 A | * | 12/1983 | Saban | ............... | H05K 7/103 439/70 |
| 4,539,621 A | * | 9/1985 | Currier | ................ | H05K 7/103 361/212 |
| 5,000,691 A | * | 3/1991 | Olsson | ................. | H05K 3/3447 439/83 |

(Continued)

FOREIGN PATENT DOCUMENTS

| | | |
|---|---|---|
| JP | 2012084686 A | 4/2012 |
| KR | 200291242 Y1 | 10/2002 |
| WO | 2002017436 A1 | 2/2002 |

OTHER PUBLICATIONS

PCT International Search Report and Written Opinion for PCT/US2019/021805; dated May 28, 2019.

(Continued)

*Primary Examiner* — Alexander Gilman
(74) *Attorney, Agent, or Firm* — Neustel Law Offices

(57) ABSTRACT

A preformed solder-in-pin system for use with electrical connectors. The preformed solder-in-pin system generally includes a connector pin having an open cavity at one end, into which a preformed solder member can be first inserted and then pressed, rather than melted, in place, such that voids and air spaces within the cavity are eliminated. The preformed solder-in-pin system can be assembled in high quantities, where the preformed solder members are placed in a fixture and the fixture is placed on a shaker table, so that large numbers of connector pins, pre-installed in connector grommets, can be inserted largely simultaneously.

28 Claims, 9 Drawing Sheets

(56) References Cited

U.S. PATENT DOCUMENTS

| | | | | |
|---|---|---|---|---|
| 5,163,856 | A * | 11/1992 | McGaffigan | B23K 3/0475 219/616 |
| 5,269,056 | A * | 12/1993 | Yang | H01R 43/0221 29/879 |
| 5,782,401 | A * | 7/1998 | Hinrichs | B23K 9/12 219/124.34 |
| 5,808,259 | A * | 9/1998 | Spinner | G01R 1/0408 219/56.22 |
| 6,137,075 | A * | 10/2000 | Grabowski | H01R 43/0214 219/56.21 |
| 6,142,787 | A * | 11/2000 | Ikesugi | H01R 13/62933 439/15 |
| 6,309,260 | B1 * | 10/2001 | Shannon | H01R 4/024 174/84 R |
| 6,392,888 | B1 * | 5/2002 | Chen | H01L 23/3672 219/56.22 |
| 6,818,839 | B2 * | 11/2004 | Hosaka | H01R 12/57 174/262 |
| 6,822,867 | B2 * | 11/2004 | Hsieh | H01L 23/40 165/185 |
| 6,887,104 | B2 * | 5/2005 | Lee | H01R 13/5845 439/374 |
| 6,945,814 | B2 * | 9/2005 | Snape | H01R 35/02 439/165 |
| 6,974,615 | B2 * | 12/2005 | Hosaka | H01R 4/024 174/257 |
| 7,973,239 | B2 * | 7/2011 | Koyama | H01R 9/0515 174/74 R |
| 8,234,783 | B2 | 8/2012 | Ng | |
| 9,904,259 | B2 * | 2/2018 | Bando | B65G 49/067 |
| 2002/0077003 | A1 * | 6/2002 | Northey | H01R 4/024 439/874 |
| 2004/0253852 | A1 * | 12/2004 | Regnier | H05K 3/3426 439/83 |
| 2008/0155823 | A1 * | 7/2008 | Heinzel | H01R 43/0207 29/842 |
| 2008/0280495 | A1 * | 11/2008 | Ko | H01R 43/0256 439/638 |
| 2011/0113626 | A1 * | 5/2011 | Ng | H01R 9/05 29/860 |
| 2014/0201989 | A1 * | 7/2014 | Paynter | H01R 4/024 29/828 |
| 2015/0229088 | A1 * | 8/2015 | Johnson | B23K 37/04 219/56.1 |
| 2015/0290736 | A1 * | 10/2015 | Zhang | B23K 26/1476 219/56.22 |

OTHER PUBLICATIONS

PCT International Search Report and Written Opinion for PCT/US2015/027111; dated Jul. 30, 2015.
PCT International Preliminary Report on Patentability for PCT/US2015/027111; dated Nov. 2, 2017.

* cited by examiner

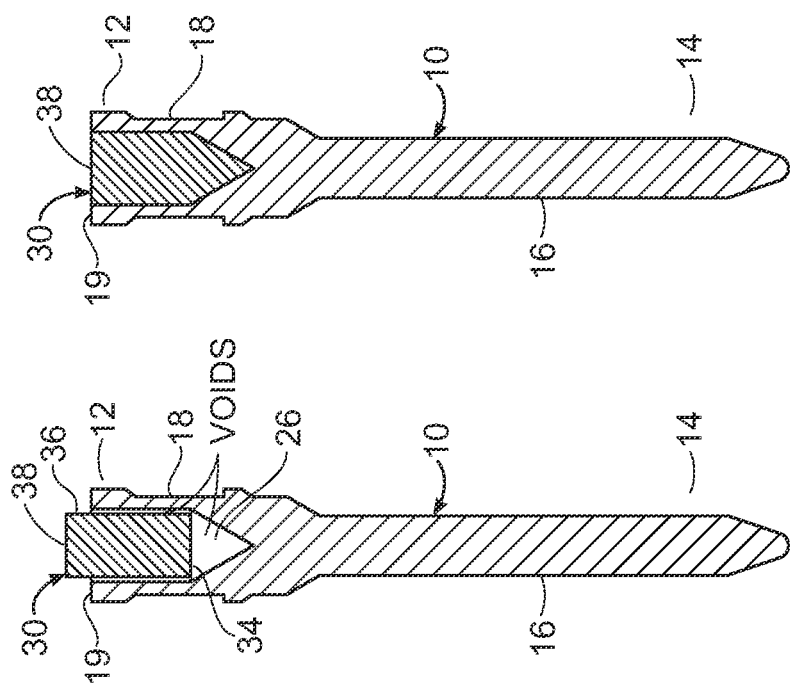
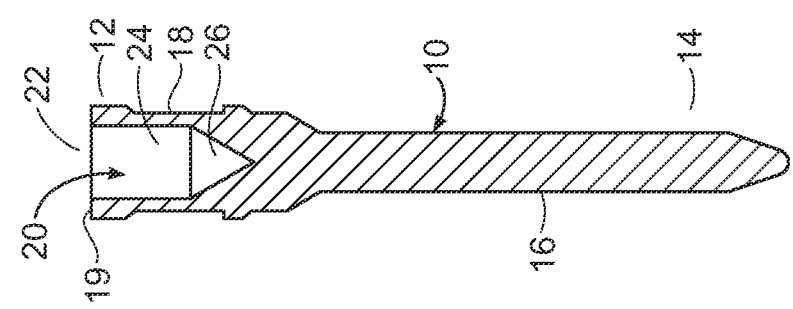
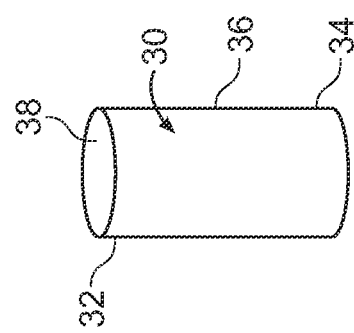
FIG. 3A    FIG. 3B    FIG. 3C
FIG. 2

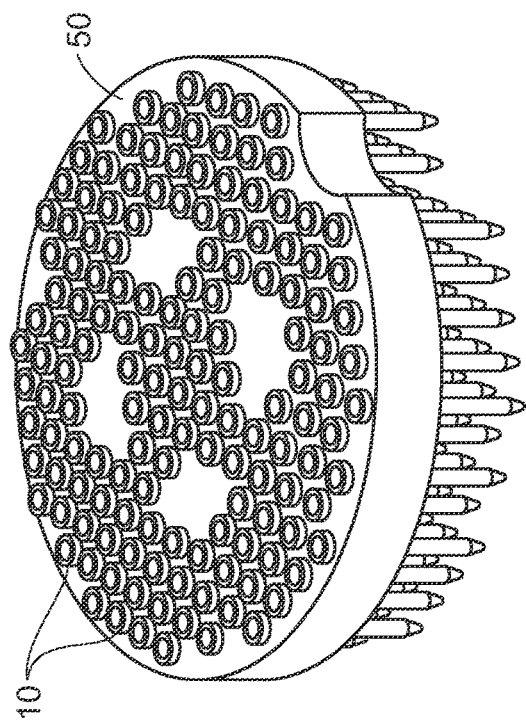
FIG. 5
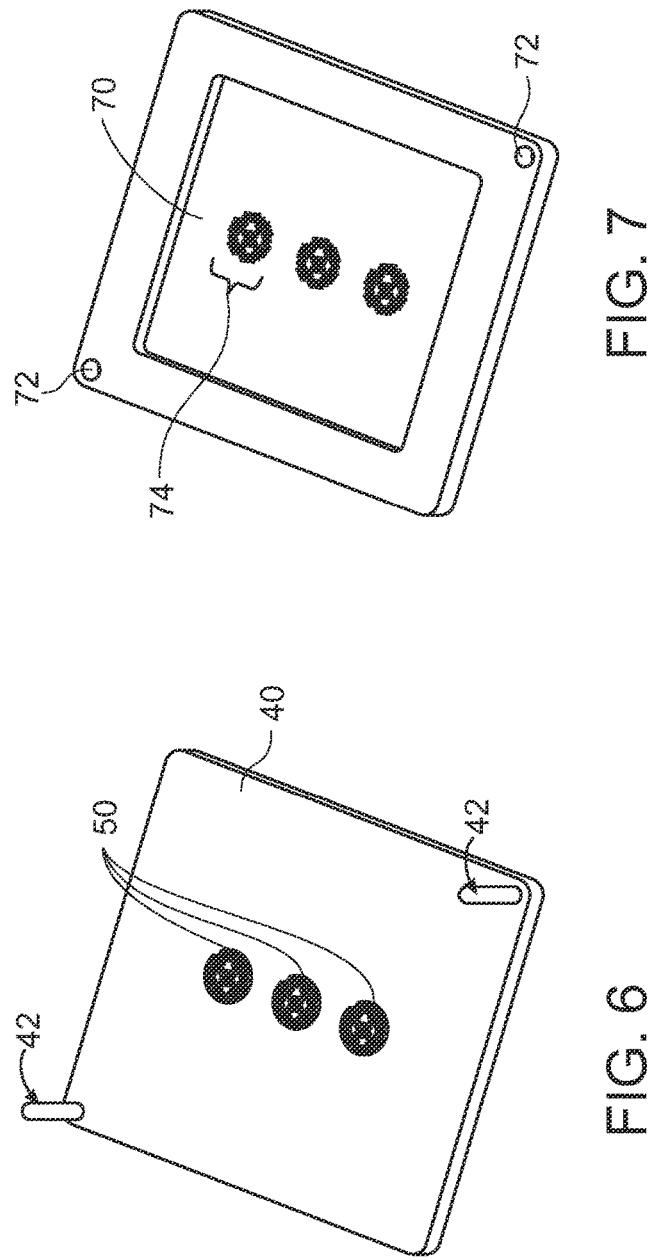
FIG. 6
FIG. 7

PREFORMED SOLDER-IN-PIN SYSTEM

CROSS REFERENCE TO RELATED APPLICATIONS

The present application is a continuation of U.S. application Ser. No. 16/297,116 filed on Mar. 8, 2019 now issued as U.S. Pat. No. 10,886,685. Each of the aforementioned patent applications, and any applications related thereto, is herein incorporated by reference in their entirety.

STATEMENT REGARDING FEDERALLY SPONSORED RESEARCH OR DEVELOPMENT

Not applicable to this application.

BACKGROUND

Field

Example embodiments in general relate to a preformed solder-in-pin system for use with electrical connectors.

Related Art

Any discussion of the related art throughout the specification should in no way be considered as an admission that such related art is widely known or forms part of common general knowledge in the field.

Solder-type connectors have been used for many years to serve as electrical interfaces between circuits and components. Such connectors typically have multiple conductive connector pins or sockets that fit within a housing to provide a seal and structural support for the pins (or sockets) that mate with corresponding sockets or pins in a mating connector.

One common way that connections of wires to the connector pins are made is with wires soldered to cavities or "cups" in the backs of the pins or sockets. To facilitate the assembly of such connectors, which can have a high number of pins or sockets, solder is typically melted into the cavities and then later melted again to install the wires, with each step typically done by hand. With high-density connectors, every manual step, such as melting solder into the pins and then hand soldering wires into the pins, can be time consuming, and further, each time solder is heated, it can be degraded.

SUMMARY

An example embodiment is directed to a preformed solder-in-pin system. The preformed solder-in-pin system includes a connector pin with a preformed solder member positioned within a cavity formed at one end of the connector pin. The connector pin generally comprises a first end and a second end, with an elongated portion proximate the second end, the elongated portion typically designed to mate with another connector. The connector pin may be made of any metal with suitable electrical and mechanical properties for use in connectors, such as copper, brass, steel, palladium, or alloys of various metals. The connector pin may be made of a single metal, an alloy, or have an alloy base (such as a copper alloy base) and be plated with another metal, such as gold or nickel.

In some example embodiments, the connector pin may comprise an upper portion proximate the first end. The connector pin may further comprise a cavity extending into the first end toward the second end, the cavity comprising an opening proximate the first end. The upper portion may be configured to receive a preformed solder member within the cavity, the solder member typically being pressed into place to tightly and completely fill the cavity, without having been first melted. Accordingly, it is only necessary to melt the solder once, which can limit degradation of the solder compared to solder that is melted multiple times. There has thus been outlined, rather broadly, some of the embodiments of the preformed solder-in-pin system in order that the detailed description thereof may be better understood, and in order that the present contribution to the art may be better appreciated. There are additional embodiments of the preformed solder-in-pin system that will be described hereinafter and that will form the subject matter of the claims appended hereto. In this respect, before explaining at least one embodiment of the preformed solder-in-pin system in detail, it is to be understood that the preformed solder-in-pin system is not limited in its application to the details of construction or to the arrangements of the components set forth in the following description or illustrated in the drawings. The preformed solder-in-pin system is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Example embodiments will become more fully understood from the detailed description given herein below and the accompanying drawings, wherein like elements are represented by like reference characters, which are given by way of illustration only and thus are not limitative of the example embodiments herein.

FIG. 2 is a perspective view of a preformed solder member in accordance with an example embodiment.

FIG. 3A is a sectional view of a connector pin in accordance with an example embodiment.

FIG. 3B is a sectional view of a connector pin in accordance with an example embodiment with a preformed solder member shown installed in the connector pin.

FIG. 3C is a sectional view of a connector pin in accordance with an example embodiment with a preformed solder member shown installed and pressed into the connector pin.

FIG. 5 is a perspective view of a connector grommet with multiple connector pins installed in accordance with an example embodiment.

FIG. 6 is a perspective view of three connector grommets positioned in a connector holder in accordance with an example embodiment.

FIG. 7 is a perspective view of a guide fixture in accordance with an example embodiment.

DETAILED DESCRIPTION

Figure 1D:
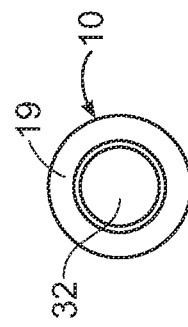
FIG. 1D is a top view of a preformed solder-in-pin system in accordance with an example embodiment with a preformed solder member shown installed and pressed into the connector pin.

A. Overview.

An example connector pin 10 with preformed solder member 30 generally comprises a first end 12 and a second end 14 of the pin, with an elongated portion 16 proximate the second end 14, the elongated portion 16 typically of the configuration to mate with another connector. The connector pin 10 may be made of any metal with suitable electrical and mechanical properties for use in connectors, such as copper, brass, steel, palladium, or alloys of various metals. The connector pin 10 may be made of a single metal, an alloy, or have an alloy base (such as a copper alloy base) and be plated with another metal, such as gold or nickel.

In some example embodiments, the connector pin 10 may comprise an upper portion 18 proximate the first end 12. The upper portion 18 may be configured to receive a wire. The connector pin 10 may further comprise a cavity 20 extending into the first end 12 toward the second end 14, the cavity 20 comprising an opening 22 proximate the first end 12.

The connector pin may also include a preformed solder member positioned in the cavity 20, the preformed solder member 30 having a solder member first end 32, a solder member second end 34, and a sidewall 36 that fits within the cavity. Typically, the preformed solder member 30 is not melted into the cavity 20, but pressed into it, so that it takes the shape of, and substantially fills, the cavity 20. Further, because it is pressed in with considerable force, and has a volume that is close to the exact volume of the cavity 20, when the solder member 30 is installed, the cavity is substantially free of voids.

In an example embodiment, the elongated portion 16 of the connector pin may be either a male or female type connector element, and may thus mate with a complementary connector type. The connector pin's elongated portion 16 may comprise a first cylindrical section and the upper portion 18 may comprise a second cylindrical section, wherein the second cylindrical section has a greater diameter than the first cylindrical section. The first cylindrical section may comprise substantially the entire length of the elongated portion. It is also possible for the upper portion 18 and the elongated portion 16 to have the same diameter, which is often (but not always) the case with female type connector pins.

In another example embodiment, the opening 22 is the only opening in the upper portion 18 of the connector pin 10. The cavity 20 may also comprise a main portion 24 that is cylindrical and coaxial with the second cylindrical section. The end of the cavity 20 opposite the opening may have different shapes, as desired by design or as a result of how the cavity 20 is formed. For example, it is possible for the cavity 20 to have a flat bottom, which would result from its formation by milling. More typically, it may also have a taper portion 26 opposite the opening, which could result from the cavity 20 being formed with a drill bit. Regardless of the cavity shape, the preformed solder member 30 will take the shape of the cavity 20 (including the taper portion), and fill it, when the solder member 30 is inserted and pressed into place. To accomplish this filling, the preformed solder member 30 will preferably have the same volume as the cavity 20, regardless of shape.

The first end 12 of connector pin 10 may comprise an upper surface 19 that is ring-shaped and planar, which will result when the cavity 20 is drilled in the center of the connector pin 10, in a coaxial manner. When the preformed solder member 30 is pressed into the cavity 20, it may comprise a first surface 38 that is substantially coplanar with the upper surface 19 of the connector pin 10, proximate the first end 12 of the connector pin 10.

In another example embodiment, the cavity 20 of the connector pin may be substantially free of voids once the preformed solder member 30 is inserted and installed. Air trapped within cavities in solder pins is undesirable, because the air can expand rapidly when the solder is heated and melted. This usually necessitates placement of a small weep hole toward the bottom of a solder cavity to allow air to escape. A weep hole is not necessary with the example embodiments described herein.

Also disclosed is a method of inserting multiple preformed solder members 30 into multiple connector pins 10 in a highly efficient manner, operating on multiple pins at once, rather than inserting and compressing the preformed solder members in place one at a time. This method can take the place of, for example, using a pick-and-place machine for initial insertion of solder preforms into connector pins. To use the method, multiple connector pins can be installed into a connector grommet 50, of the type that will hold the pins in position when a connector is fully assembled. The method involves using a connector holder 40 and a guide fixture 70 that is aligned just above the connector grommets 50 that have pins 10 installed in them.

As an example, multiple grommets/pins can be processed at once. More specifically, in an example embodiment, a connector holder 40 and a guide fixture 70 may accommodate three connector grommets. The guide fixture 70 may have openings 74 for the solder preforms to fit through, which are held in alignment with the connector pins 10, so that only one solder preform will fit through each opening 74. The fixture 70 is held in a registered position above the connector holder 40 by alignment pins 42.

Rather than work with individual solder preforms, an example method includes the steps of placing a large quantity of preforms 30 in a fixture comprising the connector holder 40, connector grommets 50, and guide fixture 70. This overall assembly is then placed on a shaker table, and with a few strokes of a brush to sweep the preformed solder members 30 over the preform openings 74, the preformed solder members will relatively quickly drop through the openings 74 and into all the connector pins 10 in the connector grommets 50.

Once the pins 10 all have preformed solder members 30 in their cavities, the guide fixture 70 can be separated from the connector holder 40, and the connector holder 40 can be used to further complete the process. In the next step, the connector holder 40 can be positioned under a press, and a press plate 60 can exert pressure on the tops of the preforms 30 to force them fully into the cavities 20 in multiple connector pins (for example, all the pins in three connectors at a time). As a result, the preformed solder members 30 can deform and, because they have a volume that is essentially the same as that of the cavity, will completely, or substantially completely, fill the cavities 20 in the connector pins 10. This process is aided by the fact that solder is considerably softer than the metal from which each connector pin is made.

B. Connector Pin.

Figure 1C:
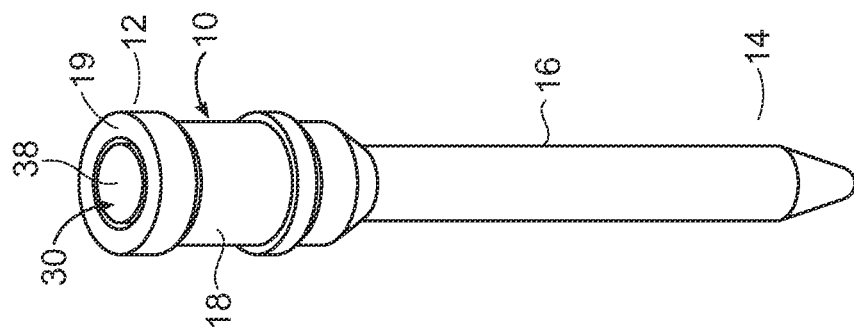
FIG. 1C is a perspective view of a preformed solder-in-pin system in accordance with an example embodiment with a preformed solder member shown installed and pressed into the connector pin.
Figure 1B:
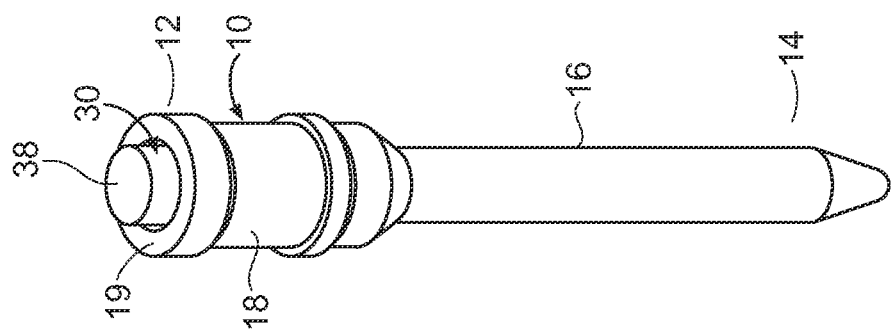
FIG. 1B is a perspective view of a preformed solder-in-pin system in accordance with an example embodiment with a preformed solder member shown installed in the connector pin.
Figure 1A:
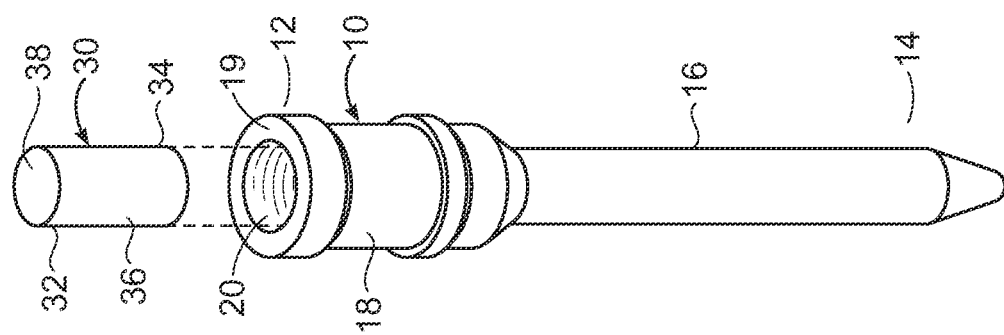
FIG. 1A is a perspective view of a preformed solder-in-pin system in accordance with an example embodiment with a preformed solder member shown prior to insertion in the connector pin.

As best shown in FIGS. 1A-1C, an example connector pin 10 suitable for use with a preformed solder member 30 generally comprises a first end 12 and a second end 14 of the pin, with an elongated portion 16 proximate the second end 14, the elongated portion 16 typically of the configuration to mate with another connector. The connector pin 10 may be made of any metal with suitable electrical and mechanical properties for use in connectors, such as copper, brass, steel, palladium, or alloys of various metals. The connector pin 10 may be made of a single metal, an alloy, or have an alloy base (such as a copper alloy base) and be plated with another metal, such as gold or nickel.

In some example embodiments, the connector pin 10 may comprise an upper portion 18 proximate the first end 12. The connector pin 10 may further comprise a cavity 20 extending into the first end 12 toward the second end 14, the cavity 20 comprising an opening 22 proximate the first end 12. The upper portion 18 may be configured to receive a wire, specifically, once solder has been inserted into the cavity 20, it can be used to solder a conductive wire to the pin.

In an example embodiment, the elongated portion 16 of the connector pin may be either a male or female type connector element, and may thus mate with a complementary connector type. The connector pin's elongated portion 16 may comprise a first cylindrical section and the upper portion 18 may comprise a second cylindrical section, wherein the second cylindrical section has a greater diameter than the first cylindrical section. The first cylindrical section may comprise substantially the entire length of the elongated portion. It is also possible for the upper portion 18 and the elongated portion 16 to have the same diameter, which is often (but not always) the case with female type connector pins.

Figure 3D:
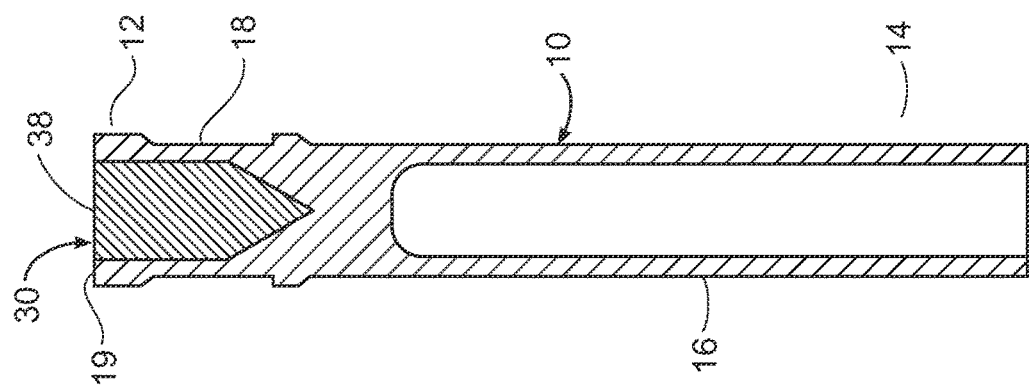
FIG. 3D is a sectional view of a female-type connector pin in accordance with an example embodiment.

As shown in FIG. 3A, in another example embodiment, the opening 22 is the only opening in the upper portion 18 of the connector pin 10. This is not usually the case with solder-type connector pins, for the following reason: When solder is placed in more traditional solder cups of connector pins, air is often trapped within the cup. Air trapped within cavities in solder pins is undesirable, because the air can expand rapidly when the solder is subsequently heated and melted. Avoiding this situation is typically done by the placement of a small weep hole toward the bottom of a solder cavity to allow air to escape. A weep hole is not necessary with the example embodiments described herein. Because the preformed solder members 30 are pressed into place, the cavity 20 of the connector pin may be substantially free of voids once the preformed solder member 30 is inserted and installed.

As also shown in FIG. 3A, the connector pin cavity 20, in the upper portion 18 of the pin, may also comprise a main portion 24 that is cylindrical and coaxial with the second cylindrical section, as would be created by drilling the pin to create the cavity 20. The end of the cavity 20 opposite the opening may have different shapes, as dictated by design or simply as a result of how the cavity 20 is formed. For example, it is possible for the cavity 20 to have a flat bottom, which would result from its formation by milling. More typically, it can have a taper portion 26 opposite the opening, which could result from the cavity 20 being formed by drilling. Regardless of the cavity shape, the preformed solder member 30 will take the shape of the cavity 20 (including the taper portion), and fill it, when the solder member 30 is inserted and pressed into place. To accomplish this filling, the preformed solder member 30 will preferably have the same volume, or very nearly the same volume, as the cavity 20, regardless of the cavity's shape.

C. Preformed Solder Member.

As shown in FIG. 2, the preformed solder members 30 generally comprise a first end 32, a second end 34, and a sidewall 36. In an example embodiment, the solder member 30 may be cylindrical, and dimensioned to fit within the cavities 20 of the connector pins of the example embodiments as shown in FIG. 1A. The preformed solder members are preferably formed without bends, burrs or deformations, so that they fit within the cavities 20. For example, wound solder can first be straightened and then cut with a blade.

As shown in FIGS. 1B and 3B, once inserted into a cavity 20, but before being pressed into position, the preformed solder members 30 may typically extend above the top surfaces 19 of the connector pins 10, supported, for example, by the taper portion 26 of the cavity. The solder members may extend, for example, about 12% to about 15% above the top of connector pin surface 19 before being pressed into place.

By design, the preformed solder members 30 may be very close in volume to the volume of the cavity 20 in the connector pins they are to be installed in. As a result, if the solder members 30 are pressed firmly into place in the cavities, the result will be that the preforms fill the cavities substantially free of air voids within the cavity, since the softer solder will deform and take the shape of the cavity when under pressure. Although the drawings are not necessarily to scale, different lengths and diameters of preformed solder members may be used.

The preformed solder members 30 may be made with many solder alloys, such as environmentally safe alloys (e.g., tin, silver, & copper), or tin and lead alloys as well.

D. Operation of Preferred Embodiment.

In use, the preformed solder-in-pin system is first created by inserting multiple precision-cut preformed solder members 30 into connector pins 10 for which they are designed. As discussed, different lengths and diameters of preformed solder members can be used, with connector pin cavities 20 sized and shaped accordingly to accommodate the preforms.

As discussed briefly above, multiple preformed solder members 30 can be inserted into multiple connector pins 10 in a highly efficient manner, operating on multiple pins at once, rather than inserting and compressing the preformed solder members in place one at a time. To use the method, multiple connector pins 10 can be installed into a connector grommet 50, of the type that will hold the pins in position when a connector is fully assembled (i.e., the grommet and pins are part of the assembled connector). This subassembly of a connector is best shown in FIG. 5.

The method involves using a connector holder 40 and a guide fixture 70 that is aligned just above the connector grommets 50 that have pins 10 installed in them. As best shown in FIG. 6, in an example embodiment, a connector holder 40 may be configured to hold three connector grommets 50, with pins 10 installed, in place. The connector holder 40 may have alignment pins 42 positioned for indexing as described herein. As an example, multiple grommets/pins can be processed at once.

Figure 8:
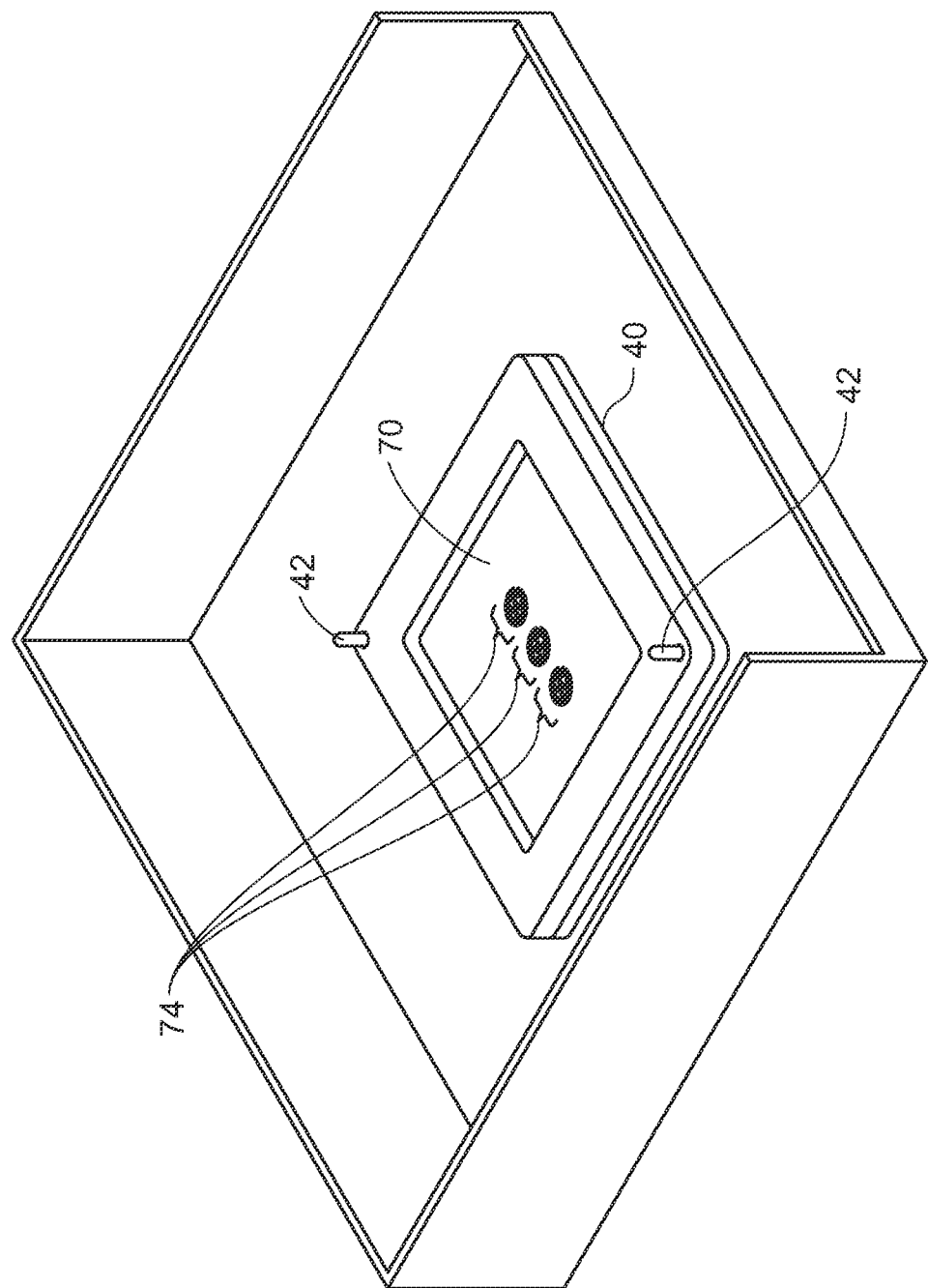
FIG. 8 is a perspective view of a guide fixture positioned over a connector holder in accordance with an example embodiment.

Also, a guide fixture 70, having the same size and shape, generally, as the connector holder 40, may be used in installing preformed solder members 30 in multiple connector pins 10. More specifically, in an example embodiment, the guide fixture 70 may be positioned above a connector holder 40, and held in precise register with alignment holes 72 into which the alignment pins 42 of the connector holder 40 will fit. So assembled, the entire assembly may be placed on a shaker table as shown in FIG. 8.

Figure 4B:
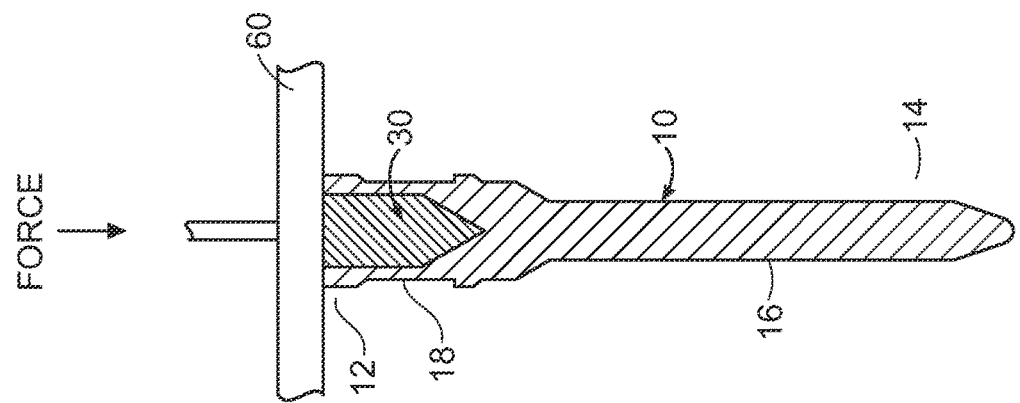
FIG. 4B is a sectional view of a connector pin in accordance with an example embodiment with a preformed solder member shown installed and pressed into the connector pin.
Figure 4A:
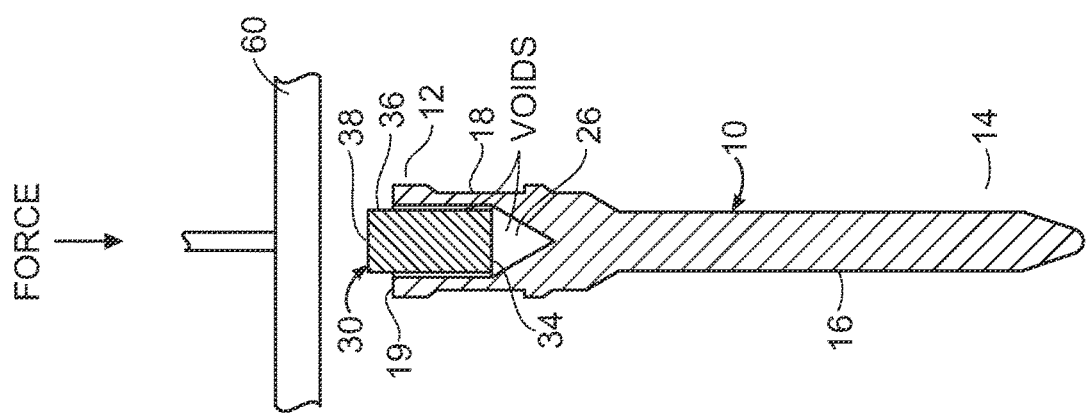
FIG. 4A is a sectional view of a connector pin in accordance with an example embodiment with a preformed solder member shown installed in the connector pin prior to being pressed into a cavity.
Figure 10:
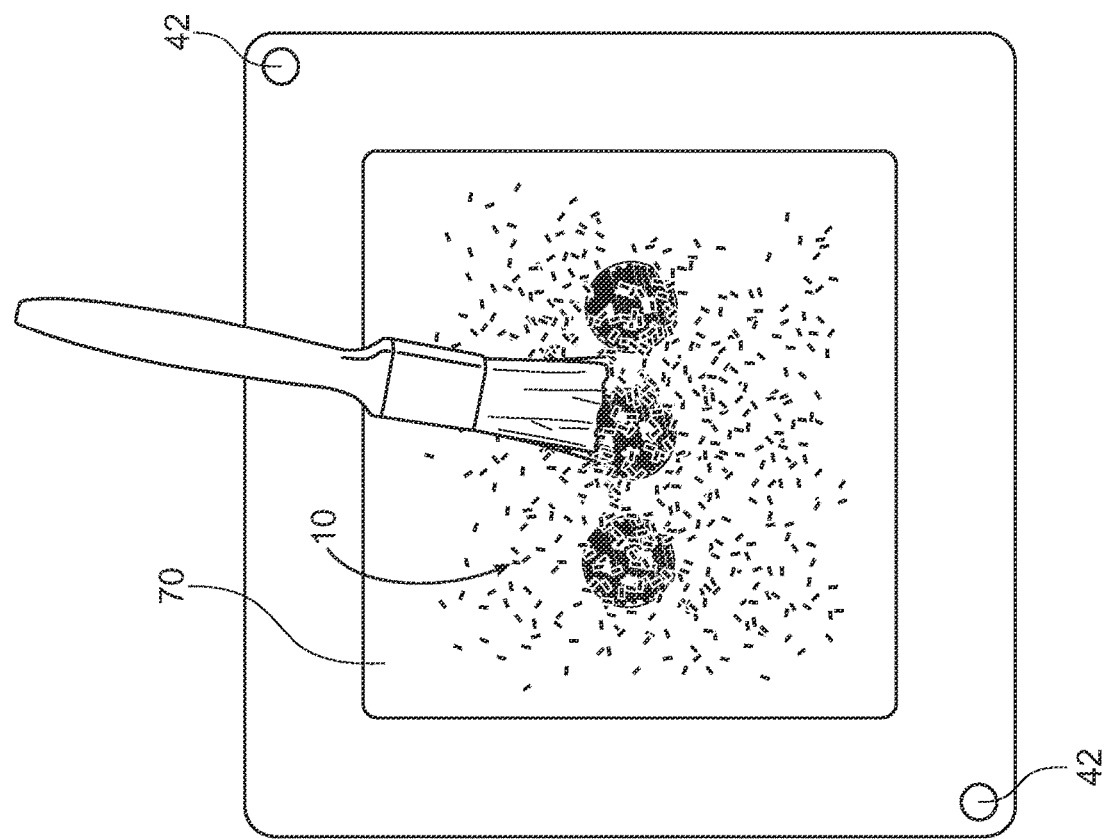
FIG. 10 is another top view of a guide fixture positioned over a connector holder with preformed solder members on the guide fixture in accordance with an example embodiment.
Figure 9:
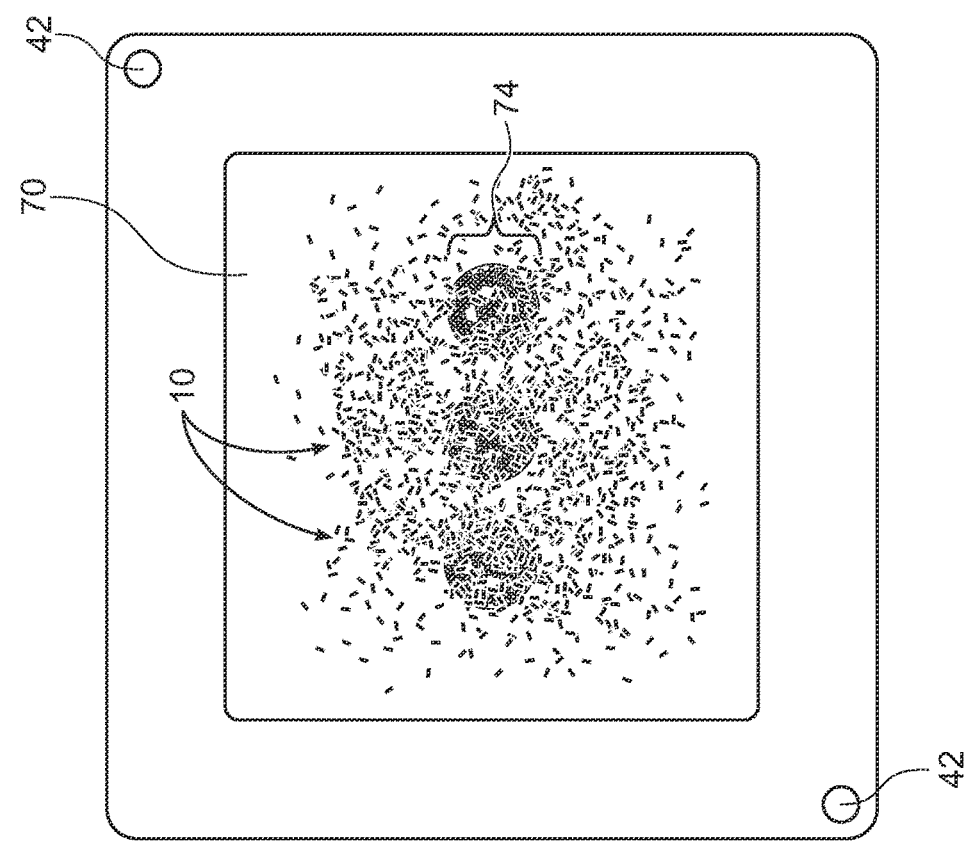
FIG. 9 is a top view of a guide fixture positioned over a connector holder with preformed solder members on the guide fixture in accordance with an example embodiment.
Figure 11:
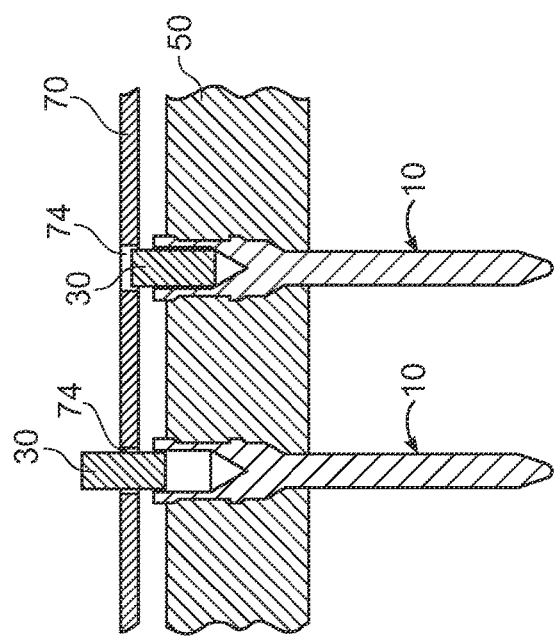
FIG. 11 is a sectional view of a guide fixture positioned over a connector grommet with preformed solder members accordance with an example embodiment.
Figure 13:
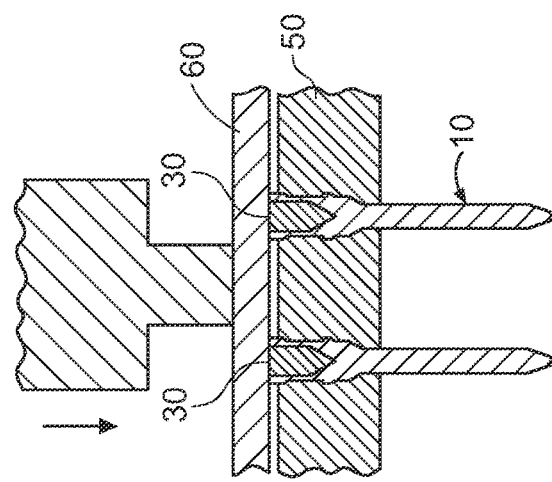
FIG. 13 is a sectional view of a connector grommet with multiple connector pins and preformed solder members installed and pressed into place, in accordance with an example embodiment.
Figure 12:
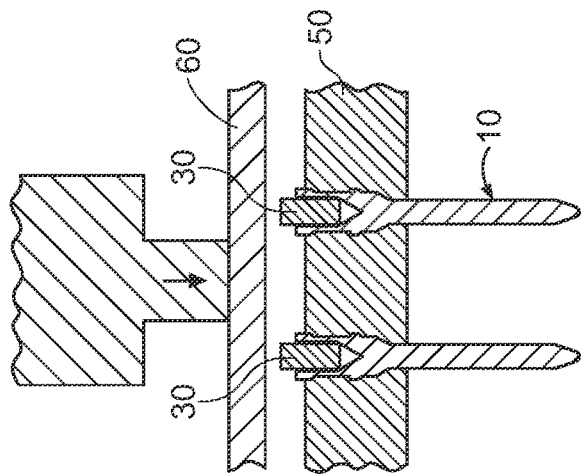
FIG. 12 is a sectional view of a connector grommet with multiple connector pins and preformed solder members installed in accordance with an example embodiment, with a press plate.

The guide fixture 70 has multiple preform openings 74, as best shown in FIGS. 7 and 11, which are aligned with the installed connector pins 10 in grommets 50. Only one solder preform 30 will fit through each opening 74, but the openings 74 are sized so that the preforms 30 will easily fit and thus readily drop into place in the positioned pins 10. Once in place on a shaker table, a very large number of preformed solder members 30 are placed on the guide fixture 70, and the shaker table is turned on so that the members 30 will also vibrate freely (see, e.g., FIG. 9). Next, an operator may use a brush or other device to sweep the preformed solder members across the preform openings 74, as shown in FIG. 10. After just a few seconds of this procedure, every exposed, unfilled connector pin cavity 20 will have a preform 30 in it, as shown in FIG. 11. As shown in FIGS. 4A, 11, and 12, the top of each preform 30 will extend above the top surface of each pin, typically by about 12-15%, but this amount will of course vary depending on the chosen dimensions of the pin cavities 20 and the preformed solder members 30.

Once the pins 10 all have preformed solder members 30 in their cavities, the guide fixture 70 can be separated from the connector holder 40, and the connector holder 40 can be used to further complete the process. In the next step, the connector holder 40 can be positioned under a press, as shown in FIGS. 4A-B and 12-13, and a press plate 60 can exert pressure on the tops of the preforms 30 to force them fully into the cavities 20 in multiple connector pins (for example, all the pins in three connectors at a time). As a result, the preformed solder members 30 will deform and, because they have a volume that is essentially the same as that of the cavity, will completely, or substantially completely, fill the cavities 20 in the connector pins 10, as best shown in FIG. 4B, where the voids that existed before the pressing operation (shown in 4A) are no longer present. This process is aided by the fact that solder is considerably softer than the metal from which each connector pin is made.

Figure 14:
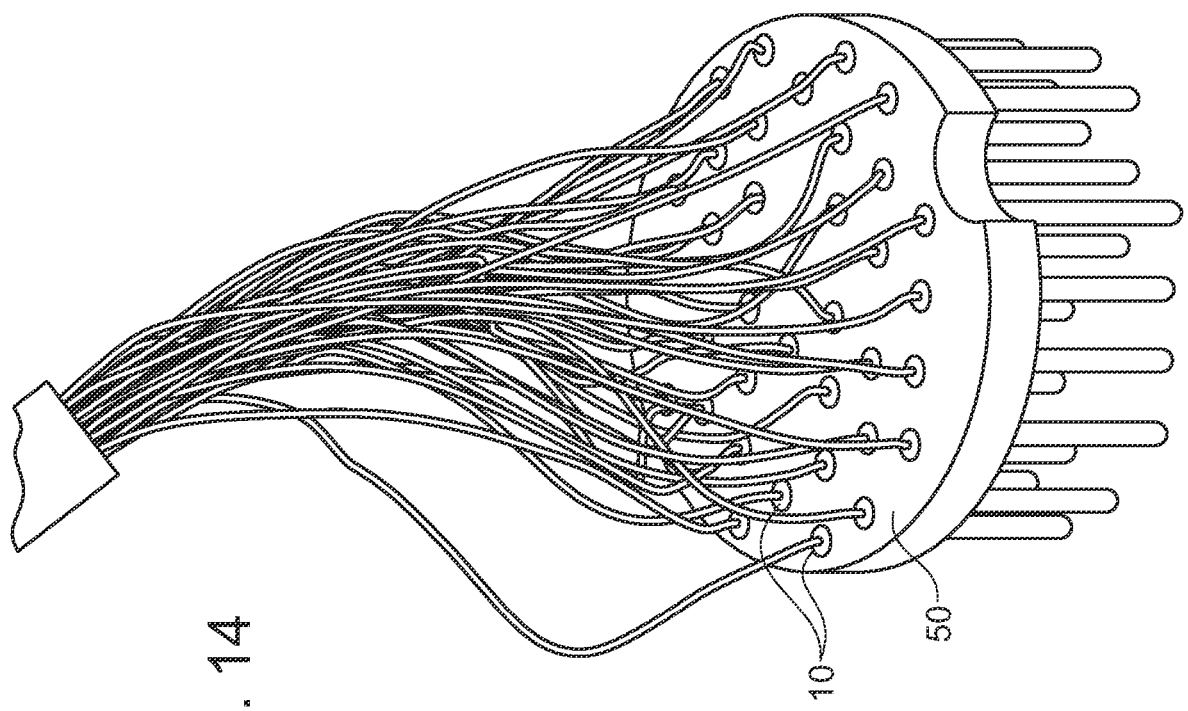
FIG. 14 is a perspective view of a connector grommet with multiple connector pins with wires installed in accordance with an example embodiment.

The resulting connector assembly can then have wires soldered to the connector pins 10 by, for example, melting the solder and inserting wires while it is still molten, resulting in the assembly shown in FIG. 14, comprising the grommet 50, connector pins 10, and one or more wires corresponding to each connector pin. Because the preformed solder members are pressed, rather than melted, into place in the pins 10 before attaching wires, the solder only needs to be melted once to make a complete connector, which is desirable because solder can degrade each time it is melted, and prolonged periods at higher temperatures can also cause dissolution of the base material of the connector pins.

Unless otherwise defined, all technical and scientific terms used herein have the same meaning as commonly understood by one of ordinary skill in the art to which this invention belongs. Although methods and materials similar to or equivalent to those described herein can be used in the practice or testing of the preformed solder-in-pin system, suitable methods and materials are described above. All publications, patent applications, patents, and other references mentioned herein are incorporated by reference in their entirety to the extent allowed by applicable law and regulations. The preformed solder-in-pin system may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

What is claimed is:

1. An electrical connector, comprising:
    a connector pin having a first end and a second end, wherein the connector pin includes an elongated portion proximate the second end of the connector pin, and wherein the elongated portion is a female-type connector element or a male-type connector element;
    wherein the connector pin further comprises a cavity extending into the first end of the connector pin, the cavity comprising an opening within the first end of the connector pin and an enclosed bottom end, wherein the cavity is cylindrical, and wherein the cavity extends into the connector pin in a coaxial manner; and
    a preformed solder member positioned in the cavity, the preformed solder member having a solder member first end and a solder member second end;
    wherein the preformed solder member is pressed into the cavity and the solder member second end is in contact with the enclosed bottom end of the cavity, wherein there are no air voids between the enclosed bottom end of the cavity and the solder member second end of the preformed solder member;
    wherein the preformed solder member has not been melted into the cavity.

2. The electrical connector of claim 1, comprising an upper portion proximate the first end, wherein the elongated portion comprises a first cylindrical section and the upper portion comprises a second cylindrical section, wherein the second cylindrical section has a greater diameter than the first cylindrical section.

3. The electrical connector of claim 2, wherein the first cylindrical section comprises substantially an entire length of the elongated portion.

4. The electrical connector of claim 1, wherein the opening is the only opening in the cavity.

5. The electrical connector of claim 1, wherein the cavity comprises a cylindrical main portion that extends from the first end toward the second end, and a taper portion opposite the opening.

6. The electrical connector of claim 5, wherein the preformed solder member substantially fills the cylindrical main portion and the taper portion of the cavity.

7. The electrical connector of claim 1, wherein the preformed solder member fills the cavity.

8. The electrical connector of claim 1, comprising an upper portion proximate the first end, wherein the upper portion comprises an upper surface that is ring-shaped and planar.

9. The electrical connector of claim 8, wherein the preformed solder member fills the cavity, and wherein the preformed solder member comprises a first surface that is substantially coplanar with the upper surface.

10. The electrical connector of claim 1, wherein the preformed solder member fills a main portion of the cavity, and wherein the preformed solder member comprises a first surface that is substantially coplanar with an upper surface of the connector pin proximate the first end.

11. The electrical connector of claim 1, wherein with the preformed solder member pressed in the cavity, the cavity is substantially free of voids.

12. The electrical connector of claim 1, wherein the enclosed bottom end is flat.

13. The electrical connector of claim 1, wherein the enclosed bottom end is tapered.

14. A electrical connector, comprising:
a connector pin having a first end and a second end, wherein the connector pin includes an upper portion proximate the first end of the connector pin, wherein the connector pin includes an elongated portion proximate the second end, and wherein the elongated portion is a female-type connector element or a male-type connector element;
a cavity extending into the upper portion from the first end toward the second end, the cavity comprising an opening proximate the first end, and wherein the cavity extends into the connector pin in a coaxial manner;
wherein the cavity comprises a cylindrical main portion that extends from the first end toward the second end, and a taper portion opposite the opening; and
a preformed solder member positioned within the cavity, the preformed solder member having a solder member first end, a solder member second end, and a sidewall that fits within the cavity;
wherein the preformed solder member is pressed into the cavity and the solder member second end is in contact with the taper portion of the cavity, wherein there are no air voids between the taper portion of the cavity and the solder member second end of the preformed solder member; and
wherein the preformed solder member has not been melted into the cavity.

15. The electrical connector of claim 14, comprising an upper portion proximate the first end, wherein the elongated portion comprises a first cylindrical section and the upper portion comprises a second cylindrical section, wherein the second cylindrical section has a greater diameter than the first cylindrical section.

16. The electrical connector of claim 14, wherein the cavity comprises a cylindrical main portion that extends from the first end toward the second end, and a taper portion opposite the opening.

17. The electrical connector of claim 14, wherein the preformed solder member fills the cavity.

18. The electrical connector of claim 14, comprising an upper portion proximate the first end, wherein the upper portion comprises an upper surface that is ring-shaped and planar.

19. The electrical connector of claim 18, wherein the preformed solder member fills the cavity, and wherein the preformed solder member comprises a first surface that is substantially coplanar with the upper surface.

20. The electrical connector of claim 14, wherein the preformed solder member fills a main portion of the cavity, and wherein the preformed solder member comprises a first surface that is substantially coplanar with an upper surface of the connector pin proximate the first end.

21. The electrical connector of claim 14, wherein with the preformed solder member pressed in the cavity, the cavity is substantially free of voids.

22. An electrical connector, comprising:
a connector pin having a first end and a second end, wherein the connector pin includes an elongated portion proximate the second end of the connector pin, and wherein the elongated portion is a female-type connector element or a male-type connector element;
wherein the connector pin further comprises a cavity extending into the first end of the connector pin, the cavity comprising an opening within the first end of the connector pin and an enclosed bottom end, wherein the cavity is cylindrical, and wherein the cavity extends into the connector pin in a coaxial manner; and
a preformed solder member positioned in the cavity, the preformed solder member having a solder member first end and a solder member second end;
wherein the preformed solder member is pressed into the cavity and the solder member second end is in contact with the enclosed bottom end of the cavity, wherein there are no air voids between the enclosed bottom end of the cavity and the solder member second end of the preformed solder member;
wherein the cavity is substantially free of voids;
wherein the preformed solder member has not been melted into the cavity.

23. The electrical connector of claim 22, comprising an upper portion proximate the first end, wherein the elongated portion comprises a first cylindrical section and the upper portion comprises a second cylindrical section, wherein the second cylindrical section has a greater diameter than the first cylindrical section.

24. The electrical connector of claim 22, wherein the cavity comprises a cylindrical main portion that extends from the first end toward the second end, and a taper portion opposite the opening.

25. The electrical connector of claim 24, wherein the preformed solder member substantially fills the cylindrical main portion and the taper portion of the cavity.

26. The electrical connector of claim 22, wherein the preformed solder member fills the cavity.

27. The electrical connector of claim 22, wherein the enclosed bottom end is flat.

28. The electrical connector of claim 22, wherein the enclosed bottom end is tapered.

* * * * *